(12) United States Patent
Miettinen

(10) Patent No.: US 8,401,803 B2
(45) Date of Patent: Mar. 19, 2013

(54) DETERMINATION OF THE LIFETIME OF A COMPONENT

(75) Inventor: Osmo Miettinen, Vaasa (FI)

(73) Assignee: Vacon Oyj, Vaasa (FI)

(*) Notice: Subject to any disclaimer, the term of this patent is extended or adjusted under 35 U.S.C. 154(b) by 850 days.

(21) Appl. No.: 12/230,408

(22) Filed: Aug. 28, 2008

(65) Prior Publication Data
US 2009/0063057 A1 Mar. 5, 2009

(30) Foreign Application Priority Data
Aug. 31, 2007 (FI) .................................. 20075600

(51) Int. Cl.
*G06F 19/00* (2011.01)

(52) U.S. Cl. .............. 702/34; 702/35; 702/81; 702/130; 702/145; 702/182

(58) Field of Classification Search .................. 702/34, 702/35, 81, 181, 182, 99, 130, 131, 136, 702/142, 145
See application file for complete search history.

(56) References Cited

U.S. PATENT DOCUMENTS

| | | | | |
|---|---|---|---|---|
| 5,852,793 A | * | 12/1998 | Board et al. ................... | 702/56 |
| 6,182,902 B1 | * | 2/2001 | Shih ............................... | 236/35 |
| 6,411,908 B1 | * | 6/2002 | Talbott .......................... | 702/34 |
| 2003/0204777 A1 | | 10/2003 | Kojori | |
| 2007/0153443 A1 | | 7/2007 | Lyons et al. | |

FOREIGN PATENT DOCUMENTS

| | | |
|---|---|---|
| EP | 1 338 874 A1 | 8/2003 |
| JP | 3-203395 A | 9/1991 |
| JP | 11-356036 A | 12/1999 |
| JP | 2002-269622 A | 9/2002 |
| JP | 2004-101417 A | 4/2004 |
| JP | 2006-166569 A | 6/2006 |
| RO | 117220 B1 | 11/2001 |

* cited by examiner

*Primary Examiner* — Jonathan C. Teixeira Moffat
*Assistant Examiner* — Hien Vo
(74) *Attorney, Agent, or Firm* — Birch, Stewart, Kolasch & Birch, LLP

(57) ABSTRACT

Method and arrangement for determining the remaining lifetime of a component of a power electronics appliance, such as a frequency converter, in which the lifetime data that is dependent on the ambient conditions and operation as specified by the manufacturer of the component is used, in which method at least one magnitude connected to ambient conditions, such as temperature, is determined, at least one loading magnitude of the component, such as speed of rotation, is determined and the calculation of the remaining lifetime is performed on the basis of at least one magnitude connected to ambient conditions, such as temperature, and of at least one loading magnitude of the component, such as speed of rotation, as well as of the lifetime data that is dependent on these ambient conditions and loading as specified by the manufacturer of the component.

15 Claims, 2 Drawing Sheets

DETERMINATION OF THE LIFETIME OF A COMPONENT

FIELD OF TECHNOLOGY

The object of this invention is a method and an arrangement for calculating the remaining lifetime of a component of a power electronics appliance, e.g. a frequency converter, and more particularly of its most wearing part, the cooling fan, and for forecasting the point in time of the shutdown necessitated by its replacement.

PRIOR ART

The competitive technical and commercial development of power electronics appliances has resulted, and will result in the future also, in increasingly higher power densities. Increasing the power density is based in particular on improving the efficiency ratio of power components as well as on improving the efficiency of the cooling.

Most of the dissipation power of a power electronics appliance, e.g. a frequency converter, occurs in the switching components of the main circuit, such as IGBT transistors and silicon diodes, that are based on power semiconductor technology. In high-power appliances also the dissipation power occurring in capacitors, chokes and busbars is also significant. The components needing most cooling are normally fixed to e.g. a cooler according to FIG. 1a, into which the dissipation power produced by them mainly passes by conductance and from where it can advantageously be further transferred to the cooling medium that is used.

Figure 1A:
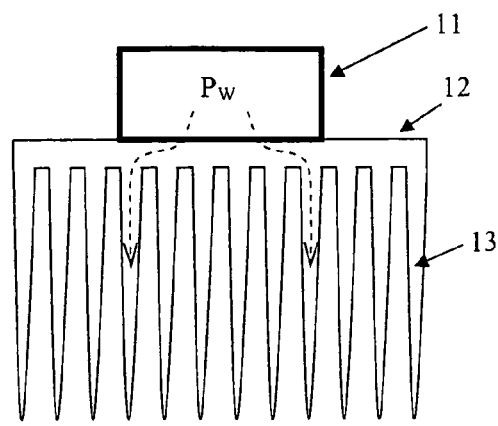

The most common method of cooling a power electronics appliance is to transfer the dissipation power produced in it to the air surrounding the appliance. A ribbed heatsink according to the example of FIG. 1a is generally used in air cooling, to which the components of the device that produce most dissipation power are fixed and via the ribs of which the dissipation power transfers by radiating to the air moving between the ribs. The faster and more turbulently the air moves between the ribs, the better the cooling power of this kind of cooler is. Effective air-cooling in fact generally requires a fan, by means of which the air is forced to pass along the desired route at the speed appropriate from the standpoint of cooling.

A power electronics appliance implemented with power semiconductor components is a static device, the only mechanically constantly moving, and thus the most wearing, part of which is specifically the cooling fan. Owing to the mechanical wear, the fan is in fact generally the most critical part from the standpoint of the lifetime of the appliance, which is recommended to be replaced at intervals of time specified by the manufacturer depending on the operating conditions. The operating conditions affecting the lifetime of the fan are mainly the temperature surrounding it and the speed of rotation.

The operating conditions of an appliance are generally variable and are not necessarily registered continuously, in which case the lifetime of the fan and also the determination of the shutdown resulting from it are inaccurate. It is in fact normal to calculate the lifetime of a fan e.g. in estimated average conditions or in the worst conditions and to determine the servicing interval in advance on that basis. The method generally results in a fully operable fan being replaced in connection with a suitable shutdown "to be on the safe side".

If the protection functions of the appliance are sophisticated, it is also possible from the standpoint of the cooled appliance itself to wait until the fan breaks and only replace it then. In this case the timing of the shutdown also is however unpredictable and it can thus occur at an awkward time from the standpoint of the operating process.

SUMMARY OF THE INVENTION

With the solution according to this invention the problems of prior art can be avoided. The solution is based on the control unit of the power electronics appliance counting continuously in real-time, or at time intervals proportioned to its total service life, the remaining service life of a component, such as a fan, on the basis of component-specific data specified by the manufacturer and programmed into the appliance. In the solution the operating conditions of the component are also registered, on the basis of which it is possible to form different models as the basis for the remaining lifetime calculation. One preferred method is to continuously calculate an average from the operating conditions and to assume that they will remain broadly similar in the future also.

Calculation of the remaining lifetime in the case of a fan is based on:

1) Temperature data of the intake air of the fan, real-time and cumulatively from the operating history, which can be estimated by direct measurement or preferably on the basis of the measured temperature of the cooler and of the known loading.

2) Rotation speed data, real-time and cumulatively from the operating history, of a rotation speed controlled fan, which can be measured or reference value data.

3) Accumulated operating hours

4) Lifetime data that is dependent on the temperature and rotation speed of the specific fan as specified by the fan manufacturer.

It is obvious to the person skilled in the art that, although the descriptive part of the invention concentrates only on a fan, the method according to the invention can also be applied to certain other components of a power electronics appliance that are critical from the standpoint of reliability, such as e.g. power capacitors, contactors and relays. In the case of a power capacitor the calculation of remaining lifetime can be based on direct or indirect measurements of the current, voltage and temperature stressing the capacitor, on accumulated operating hours and on the lifetime calculation data specified by the manufacturer of the capacitor. In the case of a contactor and a relay the information required by the calculation of the lifetime can be e.g. the number of switchings, the current and the temperature.

The characteristic features of the method and of the arrangement according to the invention are described in detail in the claims below.

By means of the invention the shutdowns necessitated by replacement of the fan or other wearing component of a power electronics appliance, preferably a frequency converter, can be scheduled accurately and according to actual need.

SHORT DESCRIPTION OF THE DRAWINGS

Figure 1B:
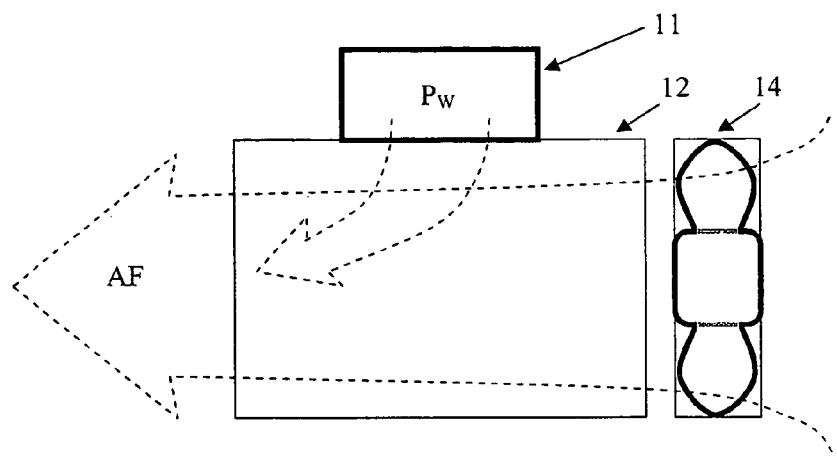
Figure 2:
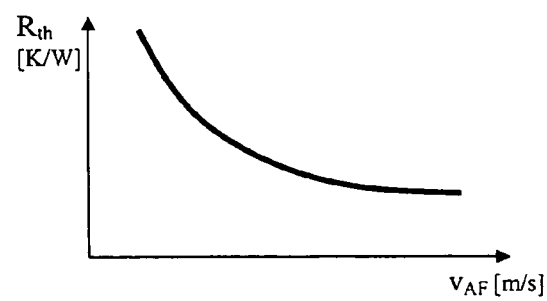
Figure 3:
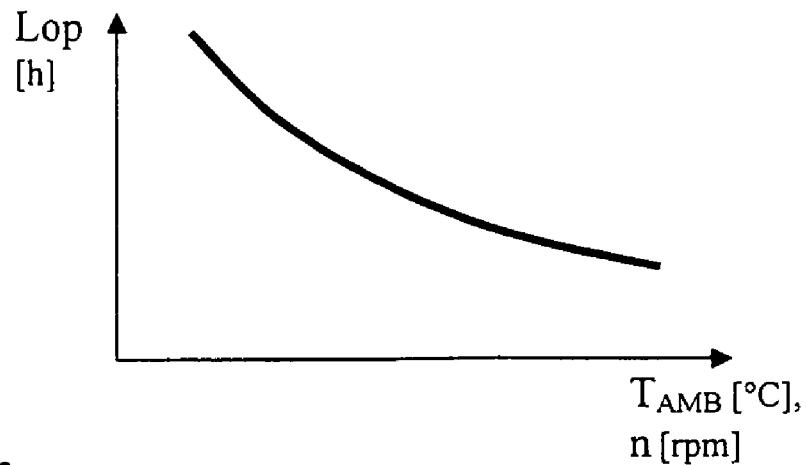
Figure 4:
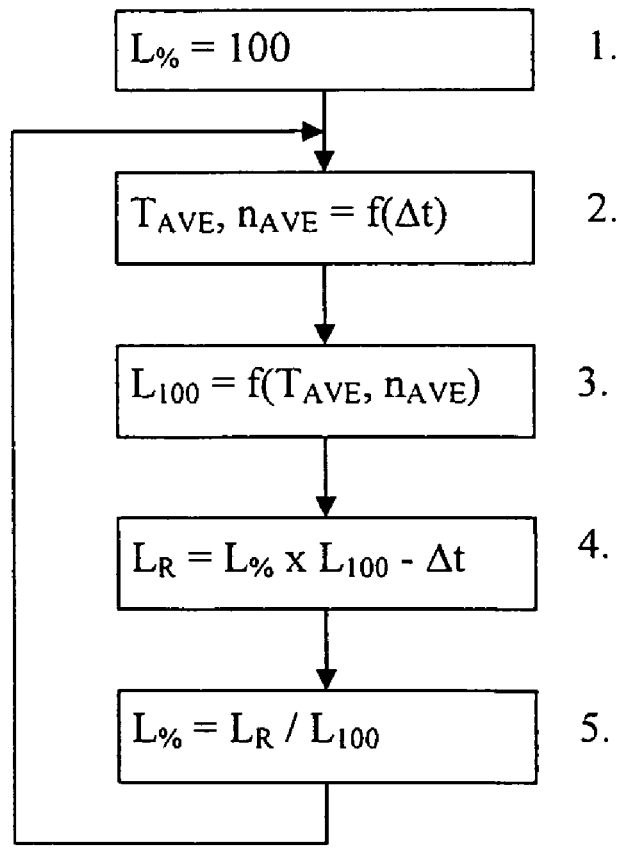

In the following, the invention will be described in more detail by the aid some embodiments with reference to the attached drawings, wherein FIG. 1a presents a component producing dissipated power and a cooler, FIG. 1b presents the transfer of dissipation power to the cooling air, FIG. 2 presents the dependency of the thermal resistance of a cooler on the speed of the air passing through it, FIG. 3 presents the dependency of the lifetime of a fan on the ambient temperature and speed of rotation, and FIG. 4 presents the progression of the lifetime calculation of a fan.

DETAILED DESCRIPTION OF EMBODIMENTS OF THE INVENTION

FIGS. 1a and 1b present an example of a cooling arrangement that is generally used for an air-cooled power component 11. The arrangement comprises a ribbed heatsink 12 manufactured with extrusion technology, which comprises a plurality of ribs 13 longitudinal to the flow of air, to which the dissipation power $P_W$ of the power component mainly transfers by conductance. The arrangement according to FIG. 1b also comprises a fan 14, which produces a forced airflow AF between the ribs 13 of the cooler 12, in which case the dissipation power $P_W$ transfers effectively from the ribs into the air.

FIG. 2 presents the characteristic behavior of the thermal resistance $R_{th}$ of this type of ribbed heatsink as a function of the rate of flow $v_{AF}$ of the air passing through it. In accordance with the figure the thermal resistance, which according to its definition describes the relationship of the rise in temperature of the cooler and the dissipation power supplied to it, is smaller the greater the rate of flow of the air is. The flow velocity of the air can be changed by adjusting the rotation speed of the fan 14.

Especially with module-type power semiconductors it is known to be advantageous to endeavor to keep the temperature of the semiconductor component as stable as possible, because temperature changes stress the internal connections of the module and via that have an impact that shortens the lifetime of the module. For this reason, among others, it is preferable to arrange the speed of rotation of the fan to be adjustable, in which case e.g. when the ambient temperature is low the speed of rotation can be reduced and via that the thermal resistance of the cooler can be raised.

From the standpoint of the lifetime of the fan the weakest part is generally the bearings; the greater the speed of rotation the faster the bearings wear mechanically. The dependency of the characteristic lifetime Lop on the speed of rotation n is according to FIG. 3. The dependency of the lifetime Lop on the temperature $T_{AMB}$ of the air passing through the fan is also the same in nature; the higher the temperature the shorter the lifetime. The details of lifetime dependencies are specific to the individual fan and they are generally ascertained in the lifetime tests conducted by fan manufacturers.

The fan is generally the only mechanically continuously moving, and thus the most wearing, part of a modern power electronics appliance, for which reason it is also normally the most critical component from the standpoint of the total lifetime of the appliance. According to this invention the computing capacity of the control unit of the appliance is utilized for calculating the remaining lifetime of the fan. This occurs on the basis of the fan-specific lifetime curves, which are of the nature of the example of FIG. 3, that are recorded in the control unit, of the operating hours registered by the control unit and of the measurement data that affect the lifetime of the fan. Of the measurement data the ambient temperature $T_{AMB}$ of the fan can be either directly measured or it can be deduced on the basis of the measured temperature of the cooler 12 and the loading of the power semiconductor 11, which are both normally known by the control unit of the appliance. The measured or preferably the reference value data can be used as the rotation speed data of the fan when the speed of rotation can be controlled by the control unit of the appliance.

Since lifetime calculations generally involve periods of several years, it is not necessarily worth performing calculations very often. On the basis of samples taken at appropriate intervals of the measurement data affecting the lifetime it is possible to e.g. form an average value that is used in the calculation of remaining lifetime. An appropriate interval depends on, among other things, how often the conditions that affect the lifetime vary.

Numerous prior-art methods can be applied to the lifetime calculation, of which the flowchart of FIG. 4 is presented here as an example. In the method the calculation is performed at certain intervals $\Delta t$, during which the averages of the collected measurement data is used in the calculation. The calculation progresses according to the example as follows:

1. Initially the relative remaining lifetime of the fan $L_{\%}$ is a full 100%.
2. The average values $T_{AVE}$ and $n_{AVE}$ of temperature and speed of rotation are calculated at the time interval $\Delta t$. Only those operating hours during which the fan is rotating are included in the time interval.
3. Based on the information specified by the manufacturer of the fan, the full lifetime $L_{100}$ of the fan is calculated in the average conditions of the time interval $\Delta t$.
4. The remaining lifetime $L_R$ of the fan at the end of the time interval $\Delta t$ is calculated by multiplying the relative remaining lifetime $L_{\%}$ by the theoretical full lifetime $L_{100}$ and deducting the duration of the time interval $\Delta t$ in question from the result.
5. The new relative remaining lifetime $L_{\%}$ of the fan is calculated by dividing the remaining lifetime $L_R$ by the theoretical full lifetime $L_{100}$.
6. After returning to point 2 the new value of L% is used in the calculation performed at the end of the next time interval $\Delta t$.

The following table contains a numerical example of the progression of the calculation with the method described above, when the calculation interval $\Delta t$ is 1000 h and the imaginary lifetime values of the fan are according to column $L_{100}$:

| t [h] | $T_{AVE}$, $n_{AVE}$ [° C., rpm] | $L_{100}$ [h] | $L_R$ [h] | $L_{\%}$ [%] |
|---|---|---|---|---|
| 0 | | | | 100 |
| 1000 | 50, 1400 | 20000 | 19000 | 95.0 |
| 2000 | 40, 1500 | 25000 | 22750 | 91.0 |
| 3000 | 30, 1450 | 30000 | 26300 | 87.7 |
| 4000 | 40, 1400 | 26000 | 21793 | 83.8 |

The calculation according to the method described gives the remaining lifetime $L_R$ in the conditions of the measuring period just ended, so that it can vary greatly and sometimes apparently even increase as the operating conditions change.

It is obvious to the person skilled in the art that the different embodiments of the invention are not limited solely to the example described above, but that they may be varied within the scope of the claims presented below. In addition to a fan, the remaining lifetime and the next shutdown can be determined also for other components incorporated in a power electronics appliance, the manufacturers of which specify their lifetime according to the use and operating conditions of the component, such as for e.g. power capacitors, contactors and relays. Determination of lifetime refers in this context to the component, or a part of it, having to be replaced with a new one or some servicing procedures having to be performed.

The invention claimed is:

1. A method for determining a remaining lifetime of an air-flow-producing, rotating electrical device of a power electronics appliance having a control unit, in which device-specific lifetime data that are dependent on ambient conditions and operation as specified by a manufacturer of said device are used, comprising:
   determining an ambient temperature of said device with said control unit;
   determining a rotational speed of said device with said control unit; and
   calculating said remaining lifetime of said device with said control unit solely on a basis of the ambient temperature of the device, the rotational speed of the device, and the device-specific lifetime data, which vary as a function of the ambient temperature and the rotational speed, as specified by the manufacturer of the device,
   the method further comprising:
   registering operation conditions of the device with the control unit, and
   forming a model on a basis of the operation conditions as a basis for the remaining lifetime calculation,
   using the model to calculate the lifetime with time intervals that are related to the lifetime and the operation conditions, and
   using values of the measurement data collected during said time intervals in the lifetime calculation.

2. The method according to claim 1, wherein the ambient temperature is measured.

3. The method according to claim 1, wherein the cooling fan is used in connection with a cooler located adjacent to the rotating electrical device, and the ambient temperature is determined on a basis of a measured temperature of the cooler and of a measured rotational speed of the rotating electrical device used in connection with the cooler.

4. The method according to claim 1, wherein the rotational speed of the rotating electrical device is measured.

5. The method according to claim 1, wherein a reference value of the rotational speed of the rotating electrical device is used in the calculation of the remaining lifetime.

6. The method according to claim 1, wherein the remaining lifetime is calculated continuously.

7. The method according to claim 1, wherein the remaining lifetime is calculated at certain intervals ($\Delta t$), and averages of the ambient temperature and the rotational speed of said rotating electrical device collected at each of the certain intervals are used in the calculation.

8. An arrangement for determining a remaining lifetime of an air-flow-producing, rotating electrical device of a power electronics appliance provided with a control unit, in which device-specific lifetime data that are dependent on ambient conditions and operation as specified by a manufacturer of the device are used,
   wherein the control unit determines an ambient temperature of the device,
   determines a rotational speed of the device, and
   calculates the remaining lifetime of said device with said control unit solely on a basis of the ambient temperature of the device, the rotational speed of the device, and the device-specific lifetime data, which vary as the function of the ambient temperature and the rotational speed, as specified by the manufacturer of the device,
   wherein operation conditions of the device are registered with the control unit, and
   on a basis of the operation conditions a model is formed as a basis for the remaining lifetime calculation,
   the lifetime is calculated in the model with time intervals that are related to the lifetime and the operation conditions, and
   values of the measurement data collected during said time intervals are used in the lifetime calculation.

9. The arrangement according to claim 8, wherein the control unit is adapted to measure the ambient temperature.

10. The arrangement according to claim 8, wherein the rotating electrical device is used in connection with a cooler located adjacent to the rotating electrical device, and the ambient temperature is determined on a basis of a measured temperature of the cooler and of a measured rotational speed of the rotating electrical device used in connection with the cooler.

11. The arrangement according to claim 8, wherein the control unit is adapted to measure the rotational speed of the rotating electrical device.

12. The arrangement according to claim 8, wherein the control unit is adapted to use a reference value of the rotational speed of the device in the calculation of the remaining lifetime.

13. The arrangement according to claim 8, wherein the control unit is adapted to calculate the lifetime continuously.

14. The arrangement according to claim 8, wherein the control unit is adapted to calculate the remaining lifetime at certain intervals ($\Delta t$), and averages of the ambient temperature and the rotational speed of the device collected at each of the certain intervals are used in the calculation.

15. A method for determining a remaining lifetime of a component of a power electronics appliance having a control unit, in which component-specific lifetime data that are dependent on ambient conditions and operation as specified by a manufacturer of said component are used, the component being a contactor,
   the method comprising:
   using the control unit for calculating the remaining lifetime of the contactor based on a number of switchings performed by the contactor, a current and an ambient temperature stressing the contactor determined based on direct or indirect measurements, and the component-specific lifetime data which vary as the function of the number of switchings, the current, and the ambient temperature specified by a manufacturer of the contactor,
   the method further comprising:
   registering operation conditions of the contactor with the control unit, and
   forming a model on a basis of the operation conditions as a basis for the remaining lifetime calculation,
   using the model to calculate the lifetime with time intervals that are related to the lifetime and the operation conditions, and
   using values of the measurement data collected during said time intervals in the lifetime calculation.

* * * * *